(12) United States Patent
Piel et al.

(10) Patent No.: US 10,658,990 B2
(45) Date of Patent: May 19, 2020

(54) HIGH FREQUENCY AMPLIFIER UNIT HAVING AMPLIFIER MODULES ARRANGED ON OUTER CONDUCTORS

(71) Applicants: Helmut Piel, Wuppertal (DE); Sergei Kolesov, Gevelsberg (DE); Nico Pupeter, Wuppertal (DE)

(72) Inventors: Helmut Piel, Wuppertal (DE); Sergei Kolesov, Gevelsberg (DE); Nico Pupeter, Wuppertal (DE)

(73) Assignee: Cryoelectra GmbH, Wuppertal (DE)

( * ) Notice: Subject to any disclaimer, the term of this patent is extended or adjusted under 35 U.S.C. 154(b) by 37 days.

(21) Appl. No.: 16/154,943

(22) Filed: Oct. 9, 2018

(65) Prior Publication Data

US 2019/0109569 A1    Apr. 11, 2019
US 2020/0099349 A9    Mar. 26, 2020

(30) Foreign Application Priority Data

Oct. 9, 2017    (DE) .................... 10 2017 123 377

(51) Int. Cl.
*H03F 1/07* (2006.01)
*H03F 3/19* (2006.01)
(Continued)

(52) U.S. Cl.
CPC .............. *H03F 3/19* (2013.01); *H01P 5/183* (2013.01); *H03F 3/602* (2013.01); *H03F 3/68* (2013.01);
(Continued)

(58) Field of Classification Search
CPC ................... H03F 1/07; H03F 1/0288
(Continued)

(56) References Cited

U.S. PATENT DOCUMENTS 5,920,240 A * 7/1999 Alexanian ................ H01P 5/12
                                                    330/286
6,344,777 B1    2/2002 Ingram et al.
(Continued)

FOREIGN PATENT DOCUMENTS

DE    10 2009 053 624 A1    5/2011
DE    10 2009 046 463 A1    8/2011
(Continued)

OTHER PUBLICATIONS

A. Jain et al., "Design of High Power Frequency Radial Combiner for Proton Accelerator," Review of Scientific Instruments, 80, Jan. 26, 2009, 4 pages.
(Continued)

*Primary Examiner* — Henry Choe
(74) *Attorney, Agent, or Firm* — Reinhart Boerner Van Deuren P.C.

(57) ABSTRACT

The invention relates to a high frequency amplifier unit comprising several amplifier modules to amplify high frequency input signals into high frequency output signals and a coaxial combiner having an outer conductor and an inner conductor arranged coaxially to this to combine the high frequency output signals of the amplifier modules, wherein the amplifier modules are arranged on the outside of the outer conductor of the coaxial combiner and the amplifier modules are connected to the coaxial inner conductor of the coaxial combiner to transmit the high frequency output signals to the coaxial combiner. The invention additionally relates to an amplifier system.

19 Claims, 5 Drawing Sheets

(51) Int. Cl.
*H05H 7/02* (2006.01)
*H01P 5/18* (2006.01)
*H03F 3/60* (2006.01)
*H03F 3/68* (2006.01)
*H05K 7/20* (2006.01)
*H01P 5/12* (2006.01)

(52) U.S. Cl.
CPC .......... *H05H 7/02* (2013.01); *H05K 7/20272* (2013.01); *H01P 5/12* (2013.01); *H05H 2007/025* (2013.01); *H05H 2007/027* (2013.01)

(58) Field of Classification Search
USPC .............................................. 330/124 R, 295
See application file for complete search history.

(56) References Cited

U.S. PATENT DOCUMENTS 9,490,517 B2 * 11/2016 Wu ........................ H01P 3/12
2016/0036113 A1 * 2/2016 Wu ........................ H01P 3/12
333/137

FOREIGN PATENT DOCUMENTS

DE 10 2013 102 552 B3 10/2014
DE 10 2015 107 729 A1 11/2016

OTHER PUBLICATIONS

A. Jain et al., "High Power Solid State RF Amplifier for Proton Accelerator," Review of Scientific Instruments, 79, Jan. 15, 2008, 8 pages.
A. Fathy et al., "A Simplified Design Approach for Radial Power Combiners," IEEE Transactions on Microwave Theory and Techniques, Jan. 1, 2006, 9 pages, Plenum, USA.

* cited by examiner

HIGH FREQUENCY AMPLIFIER UNIT HAVING AMPLIFIER MODULES ARRANGED ON OUTER CONDUCTORS

CROSS-REFERENCE TO RELATED PATENT APPLICATION

This patent application claims priority to German Application No. 10 2017 123 377.6, filed Oct. 9, 2017, the entire teachings and disclosure of which are incorporated herein by reference thereto.

FIELD

The present invention relates to a high frequency (HF) amplifier unit comprising several amplifier modules to amplify high frequency input signals into high frequency output signals and a coaxial combiner having an outer conductor and an inner conductor arranged coaxially to this to combine the high frequency output signals of the amplifier modules. Additionally, the invention relates to an amplifier system.

BACKGROUND

Accelerating resonators, in particular super-conductive cavities of particle accelerators, are defined by the construction of the accelerator (cyclotron, linear accelerator and synchrotron) and by the type of particles to be accelerated. The necessity to be supplied with high HF powers is common to all resonators in order to ensure the necessary acceleration field strengths and the desired energy gain of the particles to be accelerated. The transistor-based amplifier modules developed in recent times enable an output power of up to 500 W per amplifier module and in some instances even more than this.

Even in small accelerators, HF powers of considerably more than 10 kW are already required to operate the accelerator and in particular the accelerating resonator. In large cyclotrons or in the accelerating resonators of synchrotrons and storage rings, HF powers of up to 100 kW and more are required. The output power of dozens of amplifier modules (amplifier units) must therefore be collated for operation, i.e. combined or cumulated. For this purpose, the high frequency output signals amplified by the amplifier modules are guided by means of coaxial cables into so-called HF power combiners, which combine the amplified high frequency output signals. Therein, in high frequency technology, a combiner is understood to be an assembly which combines several weaker signals (usually of the same frequency) into a stronger signal. Usually, it simultaneously isolates the inputs from one another, such that these do not mutually influence one another, or the respective other signal generators.

On the one hand, it is problematic that the amplifier units therein, generally, generate considerable waste heat, which must be dissipated. Due to these requirements, the possible design of both the individual high frequency amplifier unit and the entire amplifier system is limited and leads, in the case of high powers, to correspondingly space-filling systems. On the other hand, in addition to this, this procedure becomes increasingly unattractive with increasing frequency of the amplified high frequency output signals to be combined because of the sharply increasing Joule losses in the coaxial cables.

Important requirements for a high frequency amplifier unit having a power combiner are therefore 1. a high economic efficiency (as low as possible investment and operating costs),
2. as low as possible supply line losses (cable) and combination losses and therefore a high efficiency,
3. a compact design and
4. an easy accessibility and exchangeability of the high frequency amplifier units and/or amplifier modules.

The object of the present invention is therefore to provide a high frequency amplifier unit and an amplifier system which fulfils one or all of these requirements.

BRIEF SUMMARY

According to a first aspect of the invention, the object is solved with a high frequency amplifier unit comprising several amplifier modules to amplify high frequency input signals into high frequency output signals and a coaxial combiner having an outer conductor and an inner conductor arranged coaxially to this to combine the high frequency output signals of the amplifier modules, in that the amplifier modules are arranged on the outside of the outer conductor of the coaxial combiner and the amplifier modules are connected to the coaxial inner conductor of the coaxial combiner to transmit the high frequency output signals to the coaxial combiner.

In that the amplifier modules are arranged on the outside of the outer conductor of the coaxial combiner and the amplifier modules are simultaneously connected to the coaxial inner conductor of the coaxial combiner to transmit the high frequency output signals to the coaxial combiner, in particular in comparison to a waveguide (without an inner conductor), an extremely space-saving high frequency amplifier unit in a compact design can be realized. The transmission of the (amplified) high frequency output signals, i.e. the power transmission from the amplifier modules to the coaxial combiner, can take place without cables due to the arrangement of the amplifier modules on the outer conductor of the coaxial combiner. As cables between the amplifier modules and the coaxial combiner are not required, the high frequency amplifier unit is only subject to minor combination losses and is quickly accessible if necessary. It has, in particular, been found that the output power of the amplifier modules can be transmitted directly to the coaxial combiner through a connection to the inner conductor of the coaxial combiner while the outer conductor of the coaxial combiner can advantageously be used simultaneously to cool the amplifier modules.

High frequency signals are preferably signals with frequencies in the radio wave and in particular in the microwave range. This means that they are preferably waves with a frequency of at least 50 MHz, preferably at least 70 MHz, more preferably at least 100 MHz and particularly preferably at least 300 MHz. Likewise it is preferred if they are waves with a frequency of at most 300 GHz, preferably at most 3 GHz. A preferred range is, for example, 1 to 3 GHz. A typical frequency for the application case of particle accelerators lies, for example, between approximately 70 MHz and 3 GHz (for example at 1.3 GHz, 1.5 GHz or 1.75 GHz). Correspondingly, preferably high frequency amplifier units, amplifier modules and coaxial combiners are referred to, which are designed to generate, amplify or guide such microwaves. The energy of the signals is therein transported in the dielectric (here preferably air) between the outer conductor and the inner conductor.

An amplifier module comprises, in particular, a transistor amplifier, which can comprise, for example, one or more power transistors, in the case of push-pull operation, for example, two power transistors. Furthermore, an amplifier module can comprise a circulator which serves to protect the upstream transistor(s). An amplifier module can, for example, be formed as a circuit board or array which can be a single piece but, for example, can also comprise a transistor circuit board and a circulator circuit board. An amplifier module preferably supplies a (nominal) power of at least 300 W, preferably at least 400 W, more preferably at least or more than 500 W. An amplifier module has a metal layer, in particular made from copper or aluminium, on the side facing towards the coaxial combiner (in particular installation side or lower side).

The high frequency amplifier unit can furthermore comprise one (or more) driver(s), one (or more) pre-amplifier(s) and/or one splitter, which serves to distribute the signals into several high frequency input signals for several amplifier modules. Such components can likewise be arranged, like the amplifier modules, on the outside of the coaxial combiner or can be a part thereof. Alternatively such components can, however, also be arranged separately, in particular if the amplifier modules already occupy substantially the entire space on the outer conductor of the coaxial combiner. Preferably, a high frequency amplifier unit comprises at least four, preferably at least six, more preferably at least eight amplifier modules.

It has proved to be advantageous if the coaxial combiner extends preferably in a longitudinal direction and has, in this respect, a tower-like geometry having side surfaces (formed by the outer conductor) extending in the longitudinal direction. The coaxial combiner, in particular the outer conductor and the coaxial inner conductor, is/are preferably produced from metal, in particular from copper and/or aluminium.

By the amplifier modules being connected to the coaxial inner conductor respectively, in particular it is understood that the output of the amplifier module (for example a coupling circuit of the amplifier module) is connected electrically to the inner conductor. The connection can, for example, occur via electrically conductive coupling pins. In this way, the amplifier modules are then connected to the coaxial inner conductor, in particular at an input-side end of the coaxial inner conductor. The decoupling of the power from the high frequency amplifier unit then occurs, for example, via an output-side end of the coaxial inner conductor, for example in that the coaxial inner conductor projects on the output-side beyond the outer conductor and, for example, serves as a probe (in particular as a (rod) antenna) to couple into a waveguide.

According to one embodiment of the high frequency amplifier unit, the coaxial combiner extends in a longitudinal direction and the outer conductor is formed to be polygonal, in particular rectangular, in cross-section on the outside. In this way, the coaxial combiner or outer conductor of the coaxial combiner can form outer or side surfaces on the outside in a simple way, which can serve as assembly surfaces for the amplifier modules. It has been shown that, in this way, an extremely compact design and arrangement of the high frequency amplifier units on further combiners can be achieved with sufficient cooling and low combination losses.

Preferably, only the outer side of the outer conductor has a corresponding geometry in cross-section, while the inner side of the outer conductor and/or the outer side of the inner conductor has a different, in particular round, geometry in cross-section. It is, however, also possible that not only the outer conductor on the outside, but additionally the outer conductor on the inside and/or the inner conductor on the outside have a corresponding or different multi-sided geometry in cross-section.

In one example, in the case of an n-cornered geometry in cross-section (and therefore n-sided), preferably n amplifier modules are arranged on the outer surface of the outer conductor of the coaxial combiner (one on each side surface). If the coaxial combiner or outer conductor is sufficiently long in the longitudinal direction, two amplifier modules can also be arranged in the longitudinal direction per side surface, for example, such that overall even 2n amplifier modules can be arranged on the outer surface of the outer conductor of the coaxial combiner.

According to a preferred embodiment of the high frequency amplifier unit, the amplifier modules are formed to be substantially flat and are arranged to be substantially flat on the outer conductor of the coaxial combiner. Preferably, the amplifier modules substantially cover the outer side of the outer conductor. As already explained, preferably at least one amplifier module is arranged on each side surface, seen in the peripheral direction.

According to a preferred embodiment of the high frequency amplifier unit, the amplifier modules are arranged on the outside of the coaxial combiner in such a way that the outer conductor of the coaxial combiner can serve to cool the amplifier modules. In this way, an in particular active cooling of the amplifier modules can be achieved with low space requirement. Previous approaches in prior art stipulated, contrary to this, to supply a central cooling board to which amplifier boards were applied on both sides to save space. Since, however, the cooling device was then provided between the amplifier modules, the output power had to be dissipated at the upper side by means of coaxial cables. According to the described embodiment, both the heat and the power emission to the coaxial combiner is possible on the underside of the module, in particular without an additional, separate cooling device arranged therebetween. For this purpose, the amplifier modules in particular are arranged directly on the outer conductor of the coaxial combiner.

Therein, the cooling of the amplifier modules is achieved preferably exclusively (apart from an unavoidable slow heat transfer through the amplifier module and the surrounding air itself) through the outer conductor of the coaxial combiner.

To achieve a high cooling efficiency and therefore high output powers, according to a preferred embodiment of the high frequency amplifier unit, the outer conductor of the coaxial combiner is formed as a part of a coolant circuit to cool the amplifier modules. As a coolant, therein for example water (for example demineralized water) is provided. For this purpose, the coaxial combiner, for example, has at least one coolant input and at least one coolant output. Preferably, the outer conductor of the coaxial combiner (in particular in the region of the corners) has, integrally, coolant lines (for example bore holes) running in the longitudinal direction at least in sections.

In order to further optimize the cooling power and output power of the high frequency amplifier unit, according to a preferred embodiment of the high frequency amplifier unit, the amplifier modules are arranged circumferentially on the outer conductor of the coaxial combiner. As already explained, therein preferably (at least) one amplifier module is arranged on each side surface provided by the outer conductor, seen in the peripheral direction. In other words, the amplifier modules are arranged in rows seen in the peripheral direction.

According to a preferred embodiment of the high frequency amplifier unit, at least one part of the amplifier modules is connected to the coaxial inner conductor at the same height, seen in the longitudinal direction. An as simple as possible geometry of the coaxial combiner and in particular of the coaxial inner conductor hereby results with as low as possible losses during transmission of the high frequency output signals to the coaxial combiner. The electrical connections (for example the coupling pins) to connect the corresponding amplifier modules then run in a plane, in particular perpendicularly to the longitudinal direction of the coaxial combiner. However, different groups of amplifier modules can also be provided, wherein the amplifier modules of one group are connected to the coaxial inner conductor at the same height, but the amplifier modules of different groups are connected at different heights, as is described below in more detail.

According to a preferred embodiment of the high frequency amplifier unit, amplifier modules of a first group of amplifier modules are arranged on the outside of the outer conductor of the coaxial combiner in a first longitudinal section of the coaxial combiner and amplifier modules of a second group of amplifier modules are arranged on the outside of the outer conductor of the coaxial combiner in a second longitudinal section of the coaxial combiner. It has been found that, despite the amplifier modules being offset in the longitudinal direction, a transmission of the high frequency output signals to the coaxial combiner can be achieved at high efficiency and, in this way, the output power of a high frequency amplifier unit can eventually be doubled.

The first longitudinal section therein preferably connects directly to the second longitudinal section. Preferably, therein the output power of all amplifier modules of the high frequency amplifier unit, as already described, is furthermore decoupled via an output-side end of the coaxial inner conductor (for example in a waveguide), which in this case lies at an end region of the first longitudinal section, said end region facing away from the second longitudinal section.

According to a preferred embodiment of the high frequency amplifier unit, the amplifier modules of the first group are connected to the coaxial inner conductor at an end region of the first longitudinal section of the coaxial combiner, said end region facing towards the second longitudinal section of the coaxial combiner and/or the amplifier modules of the second group are connected to the coaxial inner conductor at an end region of the second longitudinal section of the coaxial combiner, said end region facing towards the first longitudinal section of the coaxial combiner.

This has the advantage that the connections of the amplifier modules to the inner conductor of the coaxial combiner lie geometrically very close to one another, which keeps the combination losses low in the case of low complexity of the geometry of the coaxial combiner. Therein it has been recognized that the connections of the amplifier modules to the inner conductor of the coaxial combiner (and therefore the transmission of the high frequency output signals to the coaxial combiner) do not necessarily have to occur all exactly at the same height (seen in the longitudinal direction), which enables the arrangement of the amplifier modules offset in the longitudinal direction. The first and the second longitudinal sections are therein preferably substantially the same length.

In order to achieve a connection of the second group of amplifier modules (and therefore a doubled output power) with as low as possible combination losses and compact design, according to a preferred embodiment of the high frequency amplifier unit, it has proved to be advantageous if the coaxial inner conductor extends into the end region of the second longitudinal section of the coaxial combiner, said end region facing towards the first longitudinal section of the coaxial combiner. The second longitudinal section of the coaxial combiner has, if needed, a terminator (for example formed by a circuit board at a distance to the inner conductor or an outer conductor realized to be solid in the region of the second longitudinal section in the inner region), which prevents a spreading of the combined high frequency output signals from the connection region between amplifier modules and inner conductor (coupling region) in the direction of the second longitudinal section.

According to a preferred embodiment of the high frequency amplifier unit, the amplifier modules of the first group and the amplifier modules of the second group are connected to the coaxial inner conductor at the same height respectively, seen in the longitudinal direction of the coaxial combiner. In other words, the amplifier modules of the first group are connected to the coaxial inner conductor at a first height, seen in the longitudinal direction of the coaxial combiner, and the amplifier modules of the second group are connected to the coaxial inner conductor at a second height, seen in the longitudinal direction of the coaxial combiner.

In order to reduce undesired reflections of the high power output signals and therefore combination loss, or to prevent them as far as possible, according to a preferred embodiment of the high frequency amplifier unit, the coaxial combiner has a transformer section having a transformation behavior such that the input-side wave impedance (caused in particular by the connected amplifier modules) at the coaxial combiner is transformed into an output-side wave impedance at the coaxial combiner. As a result, in the course of a line transformation, the input-side wave impedance (in the region of the connection of the coaxial inner conductor to the amplifier modules) is transformed into a different output-side wave impedance. Therefore, the input-side wave impedance of the coaxial combiner with N amplifier modules (the lines of which typically have a wave impedance of $R_1=50$ Ohm) amounts to only approximately R/N due to the combining (which can be seen as a parallel connection). In order to transform the line into a desired wave impedance $R_2$ (typically to the original wave impedance $R_1$ again) a $\lambda/4$-transformer or a transformer acting as a $\lambda/4$-transformer can be provided, for example, as a transformer section, the length of which amounts approximately (but not necessarily exactly) to a quarter of the wave length $\lambda$ of the high frequency signals. Therefore, for example, the transformer section can also be provided in the "stepped impedance" design with diameters of the inner and/or outer conductors changing in a stepped manner, such that the length of the transformer section is clearly shorter than $\lambda/4$. The wave impedance of the transformer section $R_T$ can be estimated with $(R_1/N*R_2)^{1/2}$. If, for example, N=4 and $R_1=R_2=50$ Ohm, a wave impedance for the transformer section of approximately $R_T=25$ Ohm results. The values, $R_1$ and/or $R_2$ however, must not necessarily amount to 50 Ohm.

An advantageous geometry of the coaxial combiner has been proved if, according to a preferred embodiment of the high frequency amplifier unit, in the transformer section, the coaxial inner conductor of the coaxial combiner has a first outer diameter and the outer conductor of the coaxial combiner has a first inner diameter, and in an output section connecting to the transformer section, the coaxial inner conductor of the coaxial combiner has a second outer diameter and/or the outer conductor of the coaxial combiner has a second inner diameter. Therein, the outer diameter of the coaxial inner conductor in the output section is preferably smaller than the outer diameter of the coaxial inner conductor in the transformer section. Alternatively or additionally, the inner diameter of the outer conductor in the output section is preferably smaller than the inner diameter of the outer conductor in the transformer section. It is therein, however, advantageous in terms of production technology if either only the outer diameter of the coaxial inner conductor changes from a first to a different (smaller) second outer diameter or if only the inner diameter of the outer conductor of the coaxial combiner changes from a first to a second different (smaller) second inner diameter and the respectively different diameter remains the same. This means that the second inner diameter or outer diameter can also be the same as the first inner diameter or outer diameter.

In order to reduce undesired reflections of the high power output signals and therefore combination loss, or to prevent them as far as possible, according to a preferred embodiment of the high frequency amplifier unit, the ratio of the first inner diameter of the outer conductor to the first outer diameter of the inner conductor in the transformer section is smaller than the ratio of the second inner diameter of the outer conductor to the second outer diameter of the inner conductor in the output section. Since the wave impedance depends on the ratio of the inner diameter of the outer conductor to the outer diameter of the inner conductor, in this way a power transformation can occur. For example, the ratio of the inner diameter of the outer conductor to the outer diameter of the inner conductor in the output section is greater than 1.5, preferably greater than 2.

According to a preferred embodiment of the high frequency amplifier unit, the high frequency amplifier unit can provide an output power of at least 2 kW, preferably at least 4 kW. It has been shown that the described high frequency amplifier unit can provide correspondingly high powers with a compact design.

According to a second aspect of the invention, the object is also solved by an amplifier system, comprising several high frequency amplifier units according to the first aspect and a high frequency waveguide, wherein the high frequency amplifier units are arranged on the high frequency waveguide along the longitudinal direction of the high frequency waveguide such that the high frequency waveguide can combine the output powers of the high frequency amplifier units. The high frequency waveguide is, in particular, a waveguide preferably having a rectangular cross-section. For example, at least two, preferably at least four, more preferably at least eight high frequency amplifier units are arranged on one side of the high frequency waveguide. If the high frequency waveguides are arranged on both sides of the high frequency waveguide, the number of high frequency amplifier units and therefore the output power can be doubled.

A particularly space-saving design results if, according to a preferred embodiment of the amplifier system, the longitudinal axes of the high frequency amplifier units lie transversely, in particular perpendicularly, to the longitudinal axis of the high frequency waveguide respectively.

Particularly advantageously, according to one embodiment of the amplifier system, the coaxial inner conductors of the high frequency amplifier units at the output-side end serve as probes (for example as (rod) antennae) respectively to couple the power of the coaxial combiners into the high frequency waveguide.

Through the described high frequency amplifier units, the amplifier system can provide an output power of, for example, at least 24 kW, 48 kW or even 96 kW.

According to a preferred embodiment of the amplifier system, the high frequency amplifier units are arranged offset with respect to one another in the transverse direction of the high frequency waveguide and/or on both sides on the high frequency waveguide. The high frequency amplifier units are therein in particular arranged at a distance of one half of a (conductor) wavelength in the longitudinal direction. In particular in combination with a substantially square cross-section of the high frequency amplifier units, in this way a particularly space-saving design results.

The examples and embodiments of all aspects of the present invention described above should also be understood to be disclosed in all combinations.

Further advantageous embodiments of the different aspects are explained in the following detailed description of a number of exemplary embodiments of the aspects, in particular in combination with the figures. However, the figures enclosed with the application are only intended to be used for illustration purposes and not to define the scope of protection of the invention. The enclosed drawings are not necessarily true to scale and are simply intended to reflect in exemplary form the general concept of the present aspects. In particular, features which are contained in the figures, should in no way be considered as a necessary element of the present invention.

DETAILED DESCRIPTION

Figures 1A, 1B:
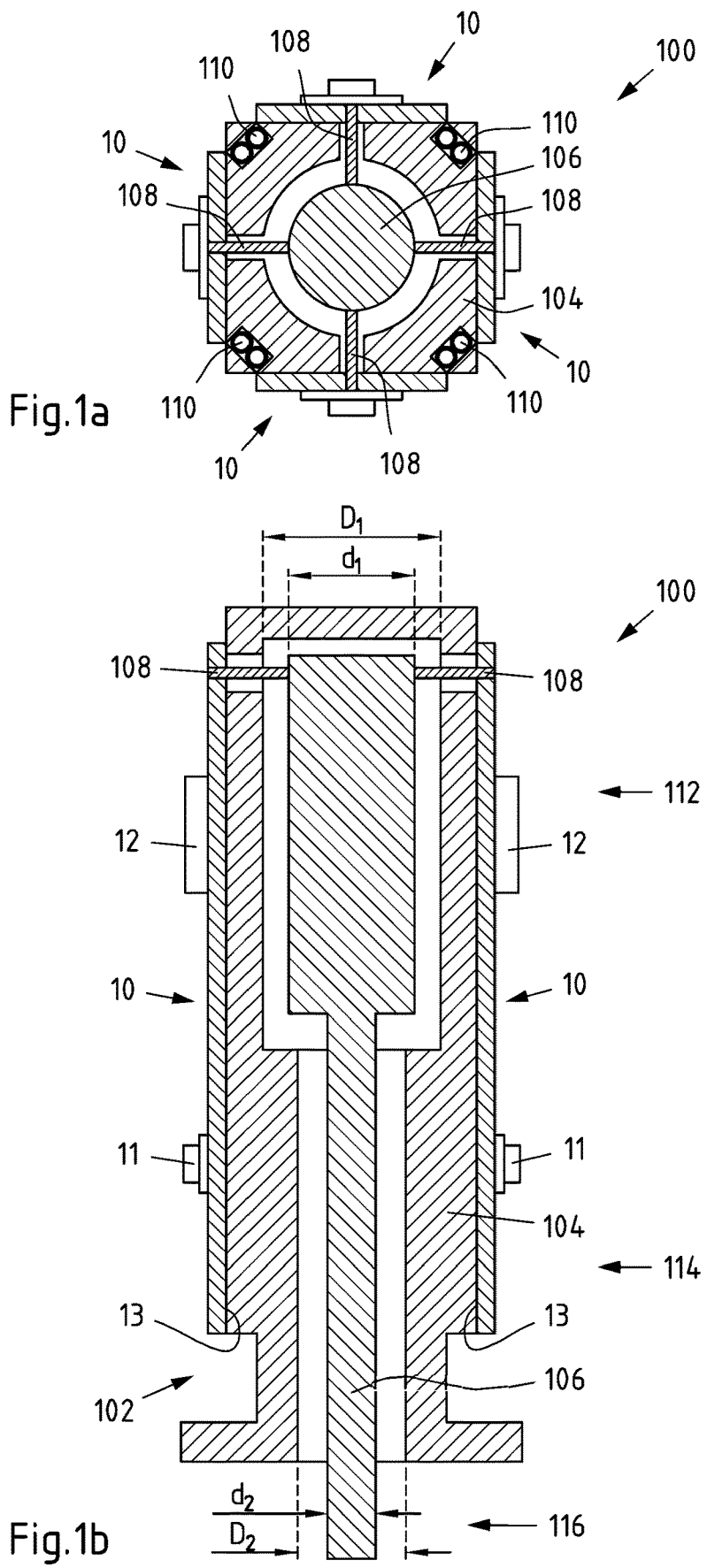
FIGS. 1a-b show an exemplary embodiment of a high frequency amplifier unit according to the invention in cross-section and in longitudinal section.

FIG. 1 firstly shows an exemplary embodiment of a high frequency amplifier unit 100 according to the invention in cross-section (FIG. 1a) and in longitudinal section (FIG. 1b). The high frequency amplifier unit 100 comprises several (here four) amplifier modules 10 to amplify high frequency input signals into high frequency output signals. The amplifier modules 10 are formed to be flat as circuit boards and comprise a transistor amplifier 11 and a circulator 12 respectively. The amplifier modules 10 have a metallic layer 13 on the underside. The high frequency amplifier unit 100 furthermore has a coaxial combiner 102 having an outer conductor 104 and an inner conductor 106 arranged coaxially to this to combine the high frequency output signals of the amplifier modules 10. The coaxial combiner 102 extends in a longitudinal direction and the outer conductor 104 is formed to be square on the outside, seen in cross-section, and therefore forms four outer sides, whilst the outer conductor 104 has a circular geometry in cross-section on the inside and the inner conductor 106 has a circular geometry on the outside.

The amplifier modules 10 are arranged to be flat on the outside of the outer conductor 104 of the coaxial combiner 102. Therein, an amplifier module 10 is arranged on each of the four outer surfaces provided by the outer conductor 104. The amplifier modules 10 are therein arranged circumferentially on the outer conductor 104 of the coaxial combiner 102 in the peripheral direction.

The amplifier modules 10 are furthermore arranged on the coaxial combiner 102 in such a way that the outer conductor 104 of the coaxial combiner 102 can serve to cool the amplifier modules 10 during operation. For this purpose, the outer conductor 104 of the coaxial combiner 102 is formed as a part of a coolant circuit to cool the amplifier modules 10, such that the outer conductor can be flowed through with a coolant via coolant lines 110.

The amplifier modules 10 are connected to the coaxial inner conductor 106 of the coaxial combiner 102 to transmit the high frequency output signals to the coaxial combiner 102 via coupling pins 108. Therein, the four amplifier modules 10 are connected to the coaxial inner conductor 106 at the same height, seen in the longitudinal direction.

The coaxial combiner 102 furthermore has a transformer section 112. The coaxial combiner 102 hereby has a transformation behavior, according to which the input-side wave impedance at the coaxial combiner 102 in the region of the coupling pins 108 is transformed into an output-side wave impedance in the region of the output section 114 at the coaxial combiner 102. The transformer section 112 constitutes in this case a $\lambda/4$ transformer, at the input of which a wave impedance of 50 Ohm/4 is present due to the four amplifier modules 10, which have a line resistance of 50 Ohm respectively. The wave impedance of the transformer section 112 here amounts to approximately 25 Ohm, in order to adapt the wave impedance to the output-side wave impedance of 50 Ohm of the output section 114.

For this purpose, in the transformer section 112, the coaxial inner conductor 106 of the coaxial combiner 102 has a first outer diameter $d_1$ and the outer conductor 104 of the coaxial combiner 102 has a first inner diameter $D_1$. In the output section 114 connecting to the transformer section 112, the coaxial inner conductor 106 of the coaxial combiner 102 has a second outer diameter $d_2$ and the outer conductor 104 of the coaxial container 102 has a second inner diameter $D_2$. Therein, the ratio $D_1/d_1$ of the first inner diameter of the outer conductor 104 to the first outer diameter of the inner conductor 106 in the transformer section 112 is smaller than the ratio $D_2/d_2$ of the second inner diameter of the outer conductor 104 to the second outer diameter of the inner conductor 106 in the output section 114.

Figure 4A:
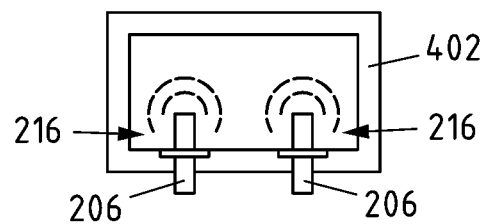
FIGS. 4a-b show an exemplary embodiment of an amplifier system according to the invention in cross-section and in top view.
Figure 4B:
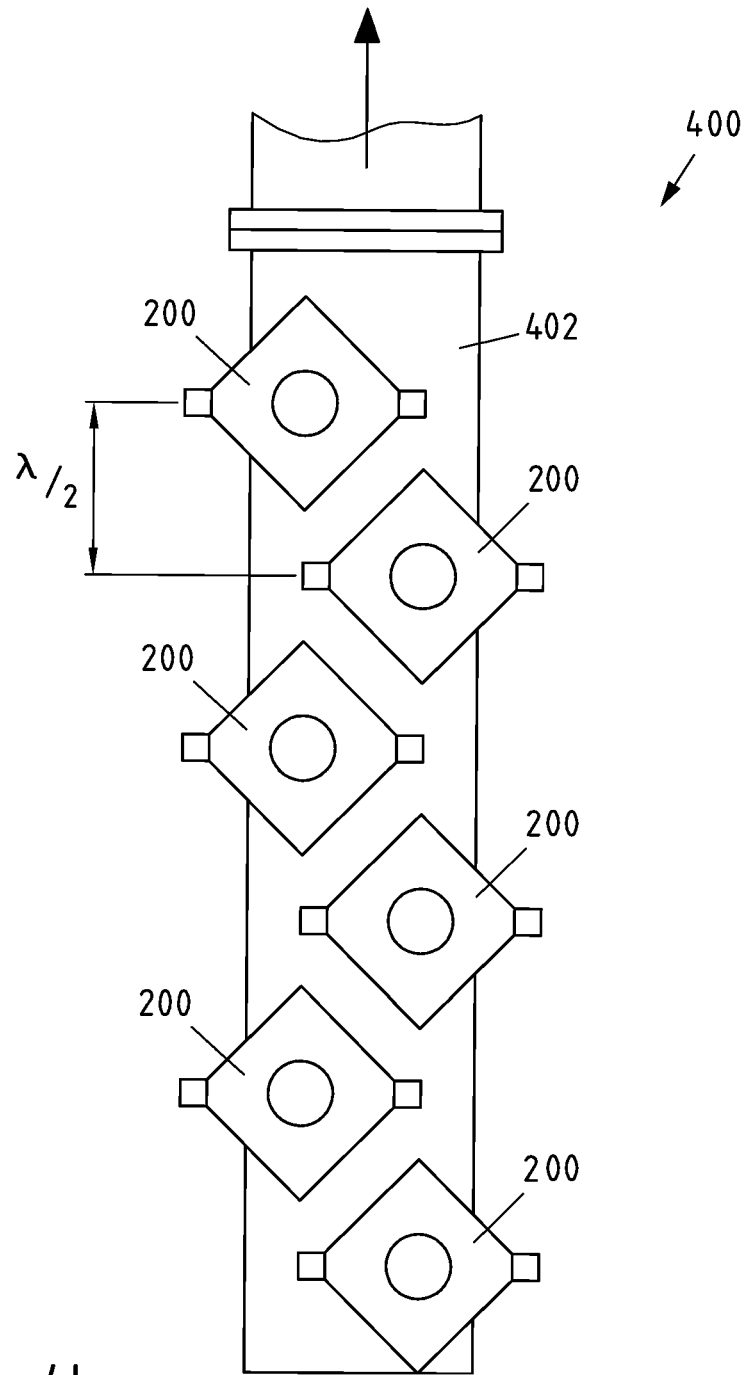
Figure 5:
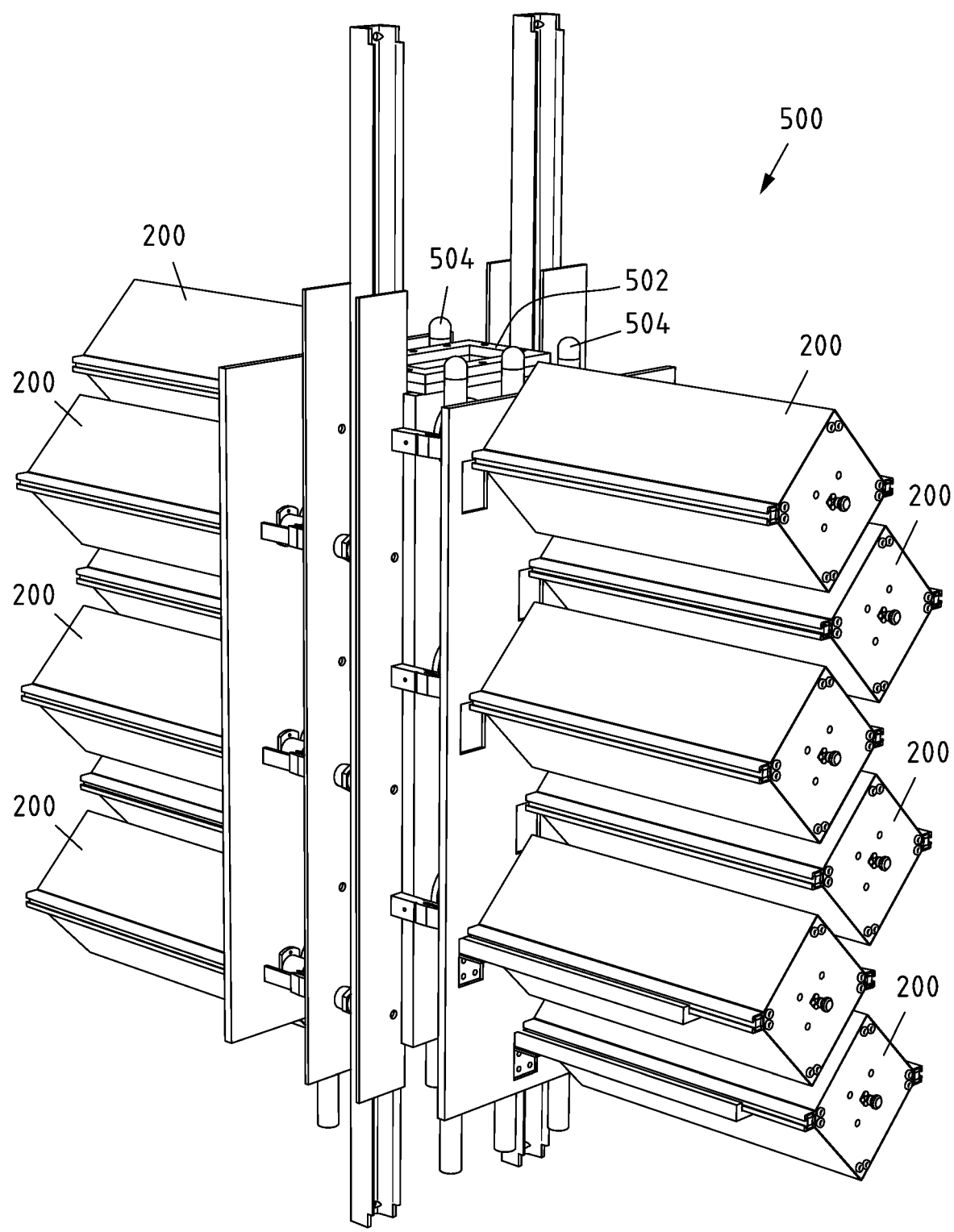
FIG. 5 shows a further exemplary embodiment of an amplifier system according to the invention.

In that the coaxial inner conductor 106 projects beyond the outer conductor 104 on the output side, this can serve as a rod antenna 116 and can decouple the power from the high frequency amplifier unit 100 and or couple it into a high frequency waveguide (see FIG. 4 or 5).

In the present example, the individual amplifier modules 10 supply a power of approximately 500 W, such that the high frequency amplifier unit 100 can supply an output power of approximately 2 kW during operation.

Figure 2:
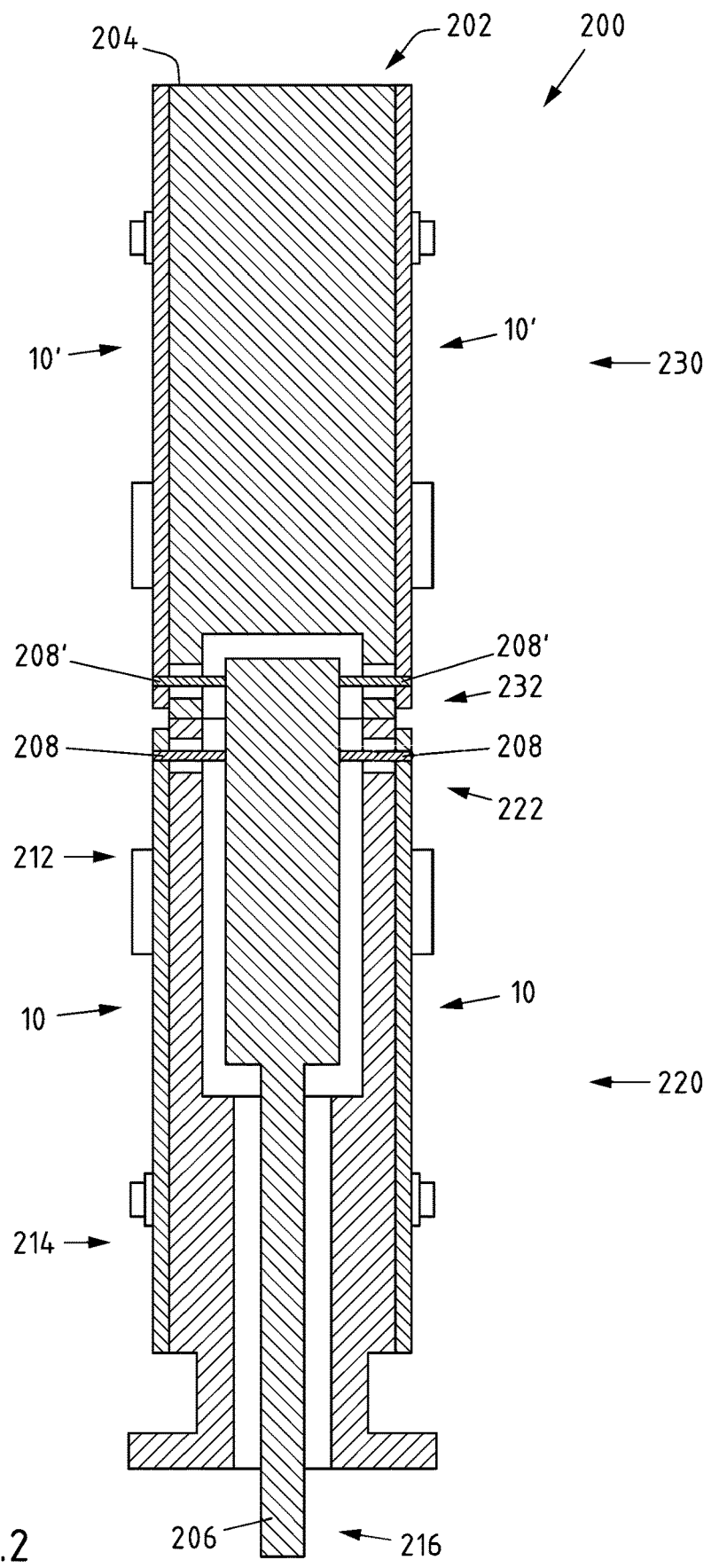
FIG. 2 shows a further exemplary embodiment of a high frequency amplifier unit according to the invention in longitudinal section.

FIG. 2 shows a further exemplary embodiment of a high frequency amplifier unit 200 according to the invention in longitudinal section. The high frequency amplifier unit 200 is built similarly to the high frequency amplifier unit 100 so that reference is first made to FIG. 1. Below, in particular the differences will be discussed, whereby corresponding reference numerals 200 are used instead of 100.

E.g. the high frequency amplifier unit 200 has a coaxial combiner 202 which is longer in the longitudinal direction, having an in particular longer outer conductor 204. Thereby not only can (in this case four) amplifier modules 10 of a first (lower) group of amplifier modules 10 be arranged in a first longitudinal section 220 of the coaxial combiner 202 on the outside of the outer conductor 204 of the coaxial combiner 202, but additionally (in this case four) further amplifier modules 10' of a second (upper) group of amplifier modules 10' can be arranged in a second longitudinal section 230 of the coaxial combiner 202 on the outside of the outer conductor 204 of the coaxial combiner 202. In this way, the output power of the coaxial combiner 202 is doubled.

Therein, the amplifier modules 10 of the first (lower) group are connected to the coaxial inner conductor 206 at an end region 222 of the first longitudinal section 220 of the coaxial combiner 202, said end region facing towards the second longitudinal section 230 of the coaxial combiner 202. The amplifier modules 10' of the second (upper) group are connected to the coaxial inner conductor 206 at an end region 232 of the second longitudinal section 230 of the coaxial combiner 202 facing towards the first longitudinal section 220 of the coaxial combiner 202. For this purpose, the coaxial inner conductor 206 extends into the end region 232 of the second longitudinal section 230 of the coaxial combiner 202, said end region facing towards the first longitudinal section 220 of the coaxial combiner 202. Furthermore the second longitudinal section 230 of the coaxial combiner 202 is formed having a solidly extended outer conductor 204 after an air gap after the end of the inner conductor 206, such that the high frequency field does not extend against the desired direction upwards into the and out of the coaxial combiner 202. Alternatively, it would, however, also be sufficient to provide a wall (circuit board) as a terminator.

As also in the case of the coaxial combiner 102, the amplifier modules 10 of the first group are connected to the coaxial inner conductor 206 by means of the coupling pins 208 at the same height respectively, seen in the longitudinal direction of the coaxial combiner 202. Likewise, the amplifier modules 10' of the second group are connected to the coaxial inner conductor 206 by means of the coupling pins 208' at the same height respectively, seen in the longitudinal direction of the coaxial combiner 202, said inner conductor extending into the second longitudinal section 230.

Figure 3:
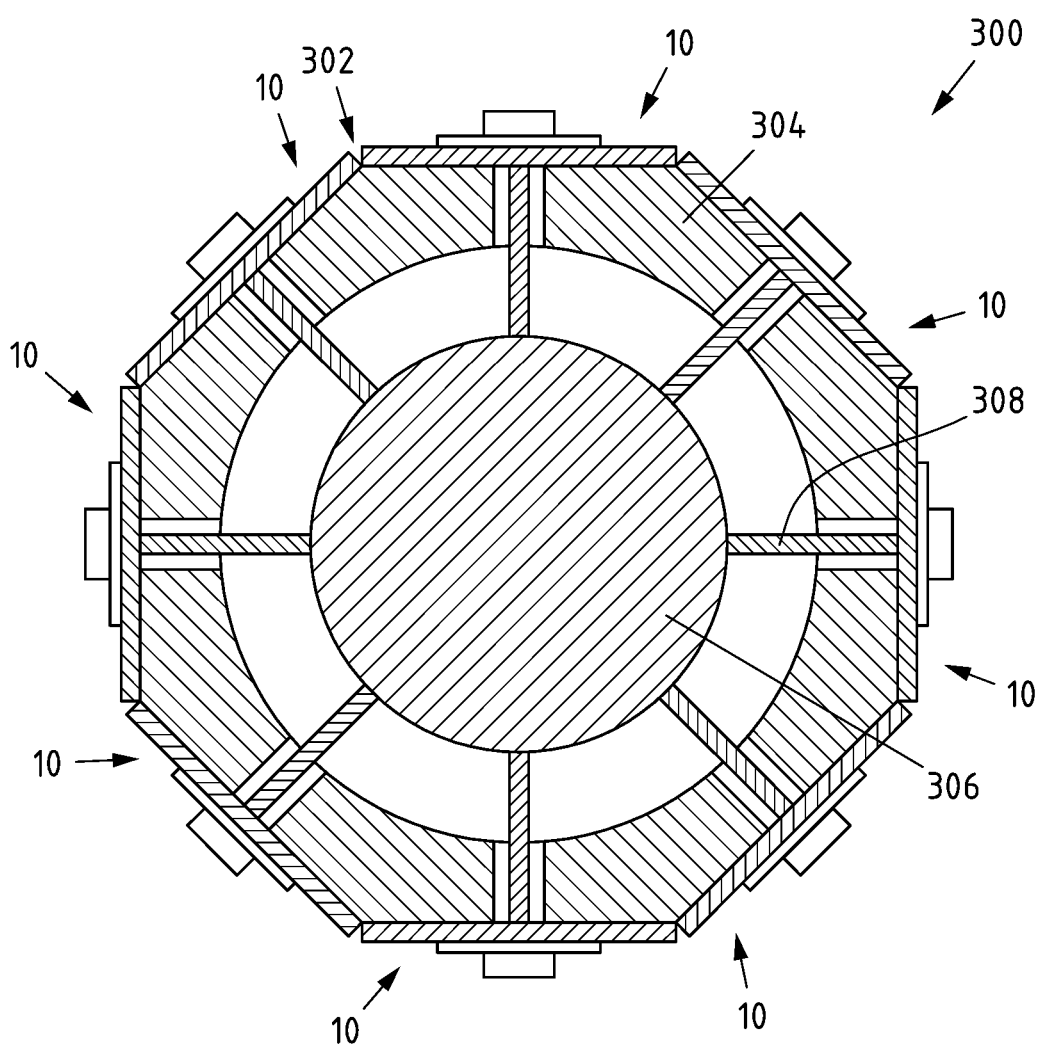
FIG. 3 shows a further exemplary embodiment of a high frequency amplifier unit according to the invention in cross-section.

FIG. 3 shows a further exemplary embodiment of a high frequency amplifier unit 300 according to the invention in cross-section. Seen in longitudinal section, the high frequency amplifier unit 300 can be built like the high frequency amplifier units 100, 200 shown in FIG. 1*b* or FIG. 2. Unlike these exemplary embodiments, the outer conductor 304 of the coaxial combiner 302 in this case is formed, however, not to be rectangular, but to be octagonal in cross-section on the outside. Eight amplifier modules 10 can thereby be arranged to be flat on the outside of the outer conductor 304. Likewise, a number of coupling pins 308 running radially inwards, corresponding to the number of amplifier modules 10, is provided to connect the amplifier modules 10 to the inner conductor 306. Like the inner conductor 306, the outer conductor 304 of the coaxial combiner 302 is again formed to be round or circular.

FIG. 4 shows an exemplary embodiment of an amplifier system 400 according to the invention in cross-section (FIG. 4*a*) and in top view (FIG. 4*b*). The amplifier system 400 comprises several of the high frequency amplifier units 200 from FIG. 2. However, the high frequency amplifier units 100 from FIG. 1 or the high frequency amplifier units 300 from FIG. 3 can likewise be provided. Furthermore, the amplifier system 400 comprises a high frequency waveguide 402 having a rectangular cross-section. The high frequency amplifier units 200 are arranged on the high frequency waveguide 402 along the longitudinal direction of the high frequency waveguide 402. Therein, the longitudinal axes of the high frequency amplifier units 200 lie perpendicularly to the longitudinal axis of the high frequency waveguide 402 respectively. The high frequency amplifier units 200 are additionally arranged on the high frequency waveguide 402 offset with respect to the central axis of the high frequency waveguide 402 in the transverse direction of the high frequency waveguide 402 and alternately offset with respect to one another and at a distance of a half wave length in the longitudinal direction. Alternatively, the high frequency amplifier units 200, however, can also be arranged only centrally on the central axis of the high frequency waveguide 402. Likewise, the high frequency amplifier units 200 can also be arranged offset with respect to the central axis in the transverse direction but in pairs of two at the same height, seen in the longitudinal direction. The high frequency amplifier units 200 can also be arranged on both opposite side walls (in FIG. 4b only the front side of the high frequency waveguide 402 can be seen). Combinations of the possibilities referred to are also conceivable. As can be recognized, in particular the rectangular or square design of the coaxial combiner 202 leads to a compact design.

The output powers of the high frequency amplifier units 200 are combined by the high frequency waveguide 402. As can be seen in FIG. 4a (which only depicts the region of the high frequency waveguide), the coaxial inner conductor 206 projects on the output side into the high frequency waveguide 402. The coaxial inner conductors 206 of the high frequency amplifier units 200 at the output-side end thereby serve as probes in the form of a rod antenna 216 to couple the power of the coaxial combiner 202 into the high frequency waveguide 402 respectively.

If one begins with an output power of the individual high frequency amplifier units 200 of 8×500 W=4 kW, the amplifier system can supply an output power of 24 kW.

FIG. 5 shows a further exemplary embodiment of an amplifier system 500 according to the invention which is similar to the amplifier system 400 already depicted in FIG. 4. The high frequency amplifier units 200 here are also arranged on a high frequency waveguide 502, wherein in principle other high frequency amplifier units 200 can also be used here. Unlike the system 400 depicted in FIG. 4, the high frequency amplifier units 200 are arranged on both sides of the high frequency waveguide 502. An output power of 48 kW, doubled compared to the amplifier system 400, thereby results. Likewise, coolant lines 504 can be recognized which transport a coolant to the high frequency amplifier units 200 such that the outer conductor 204 of the coaxial combiner 202 can be flowed through with the coolant and the waste heat of the amplifier modules 10, 10' can be guided away without further cooling devices being required between the amplifier modules 10, 10' and the coaxial combiner 202.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A high frequency amplifier unit, comprising:
   several amplifier modules to amplify high frequency input signals into high frequency output signals; and
   a coaxial combiner having an outer conductor and an inner conductor arranged coaxially to this to combine the high frequency output signals of the amplifier modules;
   wherein the amplifier modules are arranged on the outside of the outer conductor of the coaxial combiner; and
   wherein the amplifier modules are connected to the coaxial inner conductor of the coaxial combiner to transmit the high frequency output signals to the coaxial combiner.

2. The high frequency amplifier unit according to claim 1, wherein the coaxial combiner runs in a longitudinal direction and the outer conductor is formed to be polygonal, in particular rectangular, in cross-section on the outside.

3. The high frequency amplifier unit according to claim 1, wherein the amplifier modules are formed to be substantially flat and are arranged to be substantially flat on the outer conductor of the coaxial combiner.

4. The high frequency amplifier unit according to claim 1, wherein the amplifier modules are arranged on the outside of the coaxial combiner in such a way that the outer conductor of the coaxial combiner can serve to cool the amplifier modules.

5. The high frequency amplifier unit according to claim 1, wherein the outer conductor of the coaxial combiner is formed as a part of a coolant circuit to cool the amplifier modules.

6. The high frequency amplifier unit according to claim 1, wherein the amplifier modules are arranged circumferentially on the outer conductor of the coaxial combiner.

7. The high frequency amplifier unit according to claim 1, wherein at least one part of the amplifier modules is connected to the coaxial inner conductor at the same height, seen in the longitudinal direction.

8. The high frequency amplifier unit according to claim 1, wherein amplifier modules of a first group of amplifier modules are arranged on the outside of the outer conductor of the coaxial combiner in a first longitudinal section of the coaxial combiner and amplifier modules of a second group of amplifier modules are arranged on the outside of the outer conductor of the coaxial combiner in a second longitudinal section of the coaxial combiner.

9. The high frequency amplifier unit according to claim 8, wherein the amplifier modules of the first group are connected to the coaxial inner conductor at an end region of the first longitudinal section of the coaxial combiner, said end region facing towards the second longitudinal section of the coaxial combiner; and/or wherein the amplifier modules of the second group are connected to the coaxial inner conductor at an end region of the second longitudinal section of the coaxial combiner, said end region facing towards the first longitudinal section of the coaxial combiner.

10. The high frequency amplifier unit according to claim 9, wherein the coaxial inner conductor extends into the end region of the second longitudinal section of the coaxial combiner, said end region facing towards the first longitudinal section of the coaxial combiner.

11. The high frequency amplifier unit according to claim 8, wherein the amplifier modules of the first group and the amplifier modules of the second group are connected to the coaxial inner conductor at the same height respectively, seen in the longitudinal direction of the coaxial combiner.

12. The high frequency amplifier unit according to claim 1, wherein the coaxial combiner has a transformer section having a transformation behavior such that the input-side wave impedance at the coaxial combiner is transformed into an output-side wave impedance at the coaxial combiner.

13. The high frequency amplifier unit according to claim 12, wherein in the transformer section, the coaxial inner conductor of the coaxial combiner has a first outer diameter ($d_1$) and the outer conductor of the coaxial combiner has a first inner diameter ($D_1$), and that in an output section connecting to the transformer section, the coaxial inner conductor of the coaxial combiner has a second outer diameter ($d_2$) and the outer conductor of the coaxial combiner has a second inner diameter ($D_2$).

14. The high frequency amplifier unit according to claim 13, wherein the ratio of the first inner diameter ($D_1$) of the outer conductor to the first outer diameter ($d_1$) of the inner conductor in the transformer section is smaller than the ratio of the second inner diameter ($D_2$) of the outer conductor to the second outer diameter ($d_2$) of the inner conductor in the output section.

15. The high frequency amplifier unit according to claim 1, wherein the high frequency amplifier unit can provide an output power of at least 2 kW, preferably at least 4 kW.

16. An amplifier system comprising
several high frequency amplifier units according to claim 1; and
a high frequency waveguide;
wherein the high frequency amplifier units are arranged on the high frequency waveguide along the longitudinal direction of the high frequency waveguide such that the high frequency waveguide can combine the output powers of the high frequency amplifier units.

17. The amplifier system according to claim 16, wherein the longitudinal axes of the high frequency amplifier units lie transversely, in particular perpendicularly, to the longitudinal axis of the high frequency waveguide respectively.

18. The amplifier system according to claim 16, wherein the coaxial inner conductors of the high frequency amplifier units at the output-side end serve as probes respectively to couple the power of the coaxial combiners into the high frequency waveguide.

19. The amplifier system according to claim 16, wherein the high frequency amplifier units are arranged offset with respect to one another in the transverse direction of the high frequency waveguide and/or on both sides of the high frequency waveguide.

* * * * *